(12) United States Patent
Ward et al.

(10) Patent No.: US 6,621,269 B2
(45) Date of Patent: Sep. 16, 2003

(54) SYSTEM FOR MONITORING SOLENOID FLYBACK VOLTAGE SPIKE

(75) Inventors: Alan R Ward, Troy, MI (US); Haitao Lin, Novi, MI (US); Michael R Lindsay, Commerce Township, MI (US); Michael D Hesse, Dearborn Heights, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 0 days.

(21) Appl. No.: 09/832,676

(22) Filed: Apr. 11, 2001

(65) Prior Publication Data

US 2002/0149370 A1 Oct. 17, 2002

(51) Int. Cl.⁷ .............................................. F02P 17/00
(52) U.S. Cl. ...................................................... 324/388
(58) Field of Search .................................. 324/388, 389, 324/379, 257, 546; 361/154, 152; 123/490, 499

(56) References Cited

U.S. PATENT DOCUMENTS

| 4,875,391 A | | 10/1989 | Leising et al. |
| 4,939,928 A | | 7/1990 | Carle et al. |
| 5,784,245 A | * | 7/1998 | Moraghan et al. .......... 361/152 |
| 6,024,071 A | * | 2/2000 | Heimberg et al. .......... 123/490 |

* cited by examiner

*Primary Examiner*—N. Le
*Assistant Examiner*—James Kerveros
(74) *Attorney, Agent, or Firm*—Edwin W. Bacon, Jr.

(57) ABSTRACT

A method includes diagnosing a solenoid circuit to determine if the circuit has begun to degrade. By measuring characteristics associated with the electrical waveform, it is determined if the characteristics of a solenoid circuit are different from the previously measured characteristics of the circuit, or of a known functioning circuit.

2 Claims, 6 Drawing Sheets

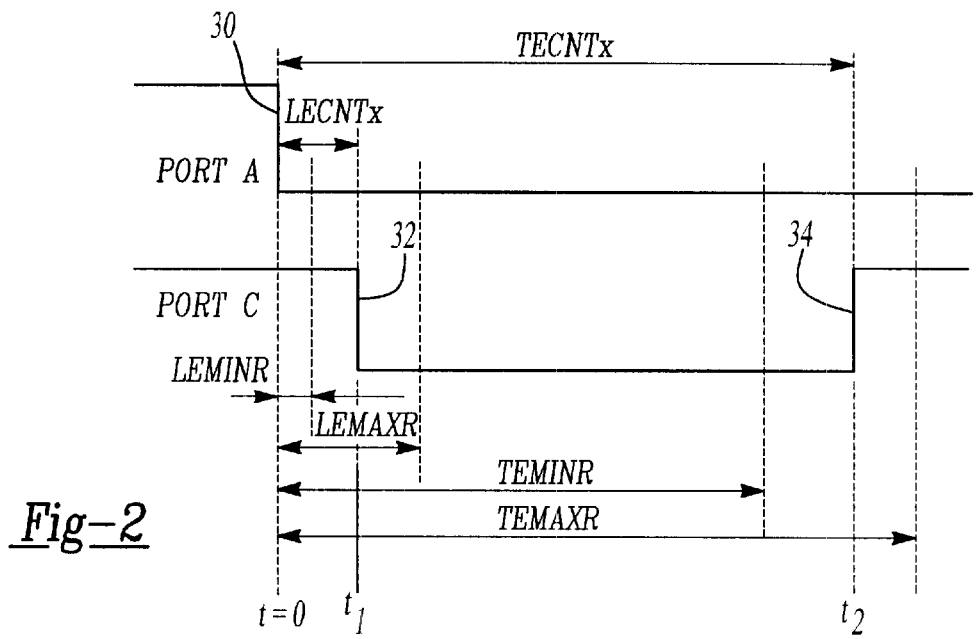
Fig-2
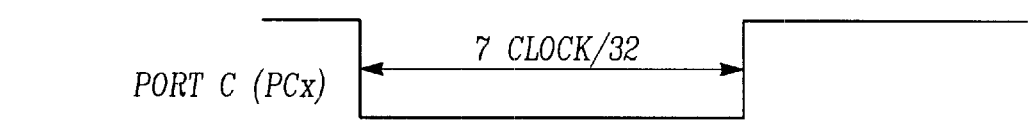
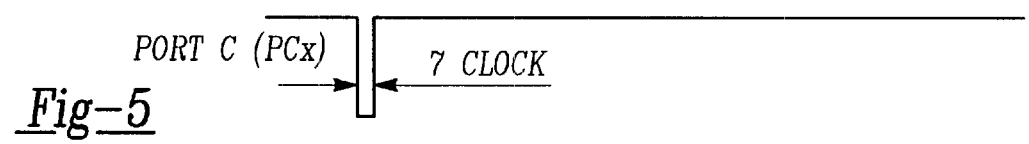
Fig-5
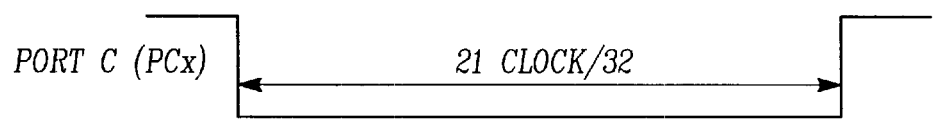

SYSTEM FOR MONITORING SOLENOID FLYBACK VOLTAGE SPIKE

BACKGROUND OF THE INVENTION

1. Technical Field

The present invention relates generally to solenoids and circuits for monitoring their operation. More particularly, the invention relates to a system for monitoring the solenoid flyback voltage spike which can be implemented within a vehicle based controller.

2. Discussion

Solenoids are electromechanical force actuating devices that may be combined with a computer system to provide control over hydraulic or mechanical equipment. Electrical signals from the computer instruct the solenoids to open or close a valve or mechanical linkage providing fine-tuned control over the operation of the equipment. With the continued decrease in the cost of microprocessors, the use of solenoids to control equipment has increased. Some examples of solenoid controlled equipment include: automotive transmissions, fuel injectors, A/C systems, aircraft control systems, and industrial manufacturing equipment.

The increasing usage of solenoids has brought with it the attendant concern of how to identify failed solenoid circuits and more importantly solenoid circuits that are just beginning to degrade. Prior to the rise of computers, solenoids typically provided basic control over equipment, either enabling or disabling the equipment. The power of computers has led to the increasing usage of solenoids to provide fine-tuned control over the performance of equipment. For example, in some automotive transmissions multiple solenoids are used to control complex hydraulic bypass and interconnection paths based upon various engine and drivetrain parameters. As a result of using multiple solenoids, incremental control over all aspects of the transmission is maintained, permitting superior gear shifting, and smoother, more responsive performance. However, using solenoids to provide incremental increases in performance greatly increases the difficulty of identifying which particular devices are failing.

Typically, solenoids are located a significant distance from the computer system that transmits the controlling signals. Signals from the computer are transmitted through wires that are part of a larger wire bundle that is passed through metal enclosures and around tight corners in harsh environmental conditions. Possible failure modes of solenoid circuits include: increased series resistance caused by corroded wires or connections, electrical shorts to chassis caused by insulation breakage, and decreased solenoid inductance. Such a failing circuit can have various effects on equipment performance ranging from intermittent decreases in performance, to continuous performance degradation, and finally to complete failure of the equipment.

When solenoids are used for basic on/off control of equipment, the failure of a device is relatively easy to ascertain since failure of the device normally would result in the equipment not working. However, when solenoids are used to provide incremental increases in performance the failure of a device might result in the equipment still working, although at a lower level of performance. More difficult yet is when a device or the circuit connected to it begins to fail intermittently. The operator perceiving a reduction in performance will take the equipment in for repair. But often, the equipment will not exhibit the reduced performance during the few moments that the repair person inspects it. This starts a cycle wherein the un-repaired equipment is returned to the operator who continues to use the defective equipment. Eventually, the device fails completely, causing the equipment to become inoperative, at which time the repair person is able to diagnose the problem. Unfortunately, sometimes waiting until the solenoid circuit fails completely will lead to the failure of the larger, more costly assembly of which it is a part. As will be appreciated, repairing solenoid circuits by first waiting until the circuit fails continuously has proven to be costly in a number of ways, such as: the operator's lost time from multiple attempts at repair, the resulting failure of the encompassing assembly, and more lost time from downtime while waiting for the assembly to be repaired.

The difficulty involved in diagnosing and repairing defective solenoid circuits is that many times the circuit will go through a period of reduced performance before complete failure. Conventional methods of diagnosing solenoid circuits entail looking for substantial changes in the electrical waveforms of the circuit. During the period of reduced performance, the electrical waveforms for a solenoid circuit will display subtle differences from normal waveforms, but nothing remotely similar to the substantial changes the repair person is looking for. The exhibited subtle differences are often similar enough to normal waveforms to be indistinguishable. However, waiting for the circuit to degrade to the point that substantial changes in the waveforms occur results in the aforementioned problems with cost, reduced equipment performance, failure of encompassing assemblies, and lost time while attempting to convince a repair person the equipment is defective.

In view of the above, it is desirable to provide a system for detecting changes in the electrical characteristics of a solenoid circuit that is still functional.

It is further desirable to provide a system for determining when a solenoid circuit has completely failed.

Finally, it is desirable to provide a low cost system for detecting changes in the electrical characteristics of a functioning solenoid circuit, which can be implemented in conjunction with a microprocessor.

SUMMARY OF THE INVENTION

The present invention offers a method of diagnosing a solenoid circuit to determine if the circuit has begun to degrade. By measuring characteristics associated with the electrical waveform it can be determined if the characteristics of a solenoid circuit are different from the previously measured characteristics of the circuit, or of a known functioning circuit.

A solenoid flyback voltage signal is shaped by a suitable wave shaping circuit for defining the leading edge and trailing edge of the signal. Accordingly, the relative timing of the flyback voltage signal is more important than the peak voltage levels of the signal.

A solenoid driver circuit controls the switching function of the solenoid. When the solenoid is switched off, the solenoid produces the flyback voltage signal. A solenoid control signal from the solenoid driver circuit is output on a first port to a flyback voltage monitoring circuit. The analog flyback voltage signal is processed by a waveshaping circuit and is output on a second port to the flyback voltage monitoring circuit. The waveshaping circuit transforms the analog voltage signal to an approximately square wave logic level signal which is suitable for processing by a logic circuit of the flyback voltage monitoring circuit.

Further areas of applicability of the present invention will become apparent from the detailed description provided hereinafter. It should be understood however that the detailed description and specific examples, while indicating preferred embodiments of the invention, are intended for purposes of illustration only, since various changes and modifications within the spirit and scope of the invention will become apparent to those skilled in the art from this detailed description.

BRIEF DESCRIPTION OF THE DRAWINGS

Additional objects, advantages and features of the present invention will become apparent from the following description and appended claims, taken in conjunction with the accompanying drawings in which:

FIG. 2 is a waveform diagram showing the relative timing between the solenoid [driver] control signal (port A) and the solenoid flyback voltage signal (port C);

FIG. 5 is a waveform diagram showing three exemplary wave forms associated with the control/monitoring port of the flyback voltage monitoring circuit in accordance with the present invention.

DETAILED DESCRIPTION OF THE PREFERRED EMBODIMENT

Figure 1:
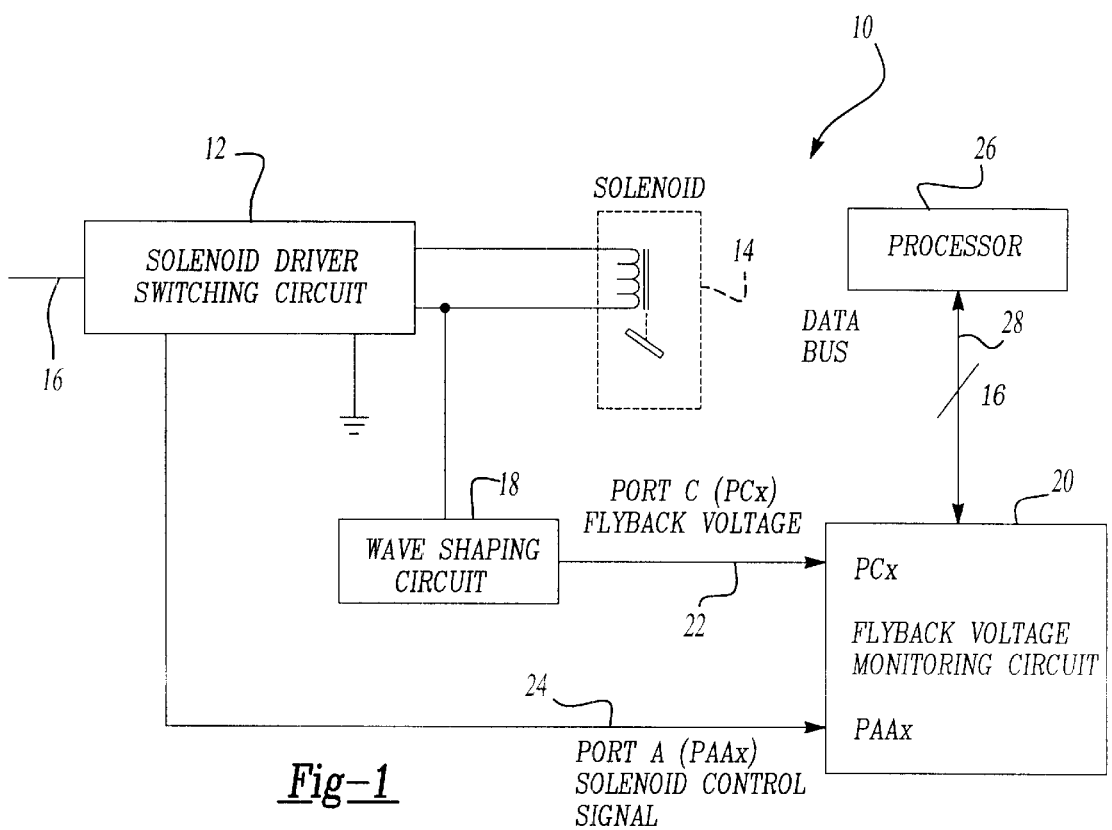
FIG. 1 is a schematic diagram showing the interaction between the solenoid switching circuitry and the flyback voltage monitoring circuit in accordance with a preferred embodiment of the present invention.

Referring to FIG. 1, the solenoid control and monitoring system 10 is shown according to a preferred embodiment of the invention. The solenoid control and monitoring system 10 includes a solenoid driver switching circuit 12 for operating one or more electronic solenoids 14. The solenoid switching circuit 12 receives its switching control information from an external controller, such as the electronic transmission control module (not specifically shown) via a control line or bus 16. The solenoid 14, or a group of solenoids are preferably used for operating a valve or mechanical linkage associated with an electronically controlled automatic transmission. However, one skilled in the art will readily appreciate that the monitoring system 10 and solenoids 14 of the present invention can be utilized in a variety of applications.

A wave shaping circuit 18 is connected between the solenoid driver circuit 12 and the solenoid 14. The wave shaping circuit 18 functions to sample the voltage signal produced by the operating characteristics of the solenoid 14 and provide a cleaned up digital signal having a leading edge and a trailing edge that can be further sampled and processed by the flyback voltage monitoring circuit 20 of the present invention. As shown, the flyback voltage monitoring circuit 20 includes port "C" 22 which receives the flyback voltage signal PCx from the wave shaping circuit 18, and includes port "A" 24 which receives the solenoid control signal PAAx passed on by the solenoid driver circuit 12. A processor 26, which may be part of the electronic transmission control module, communicates bi-directionally with the flyback voltage monitoring circuit 20. The components and function of the monitoring circuit 20 are described in greater detail with regard to FIGS. 3 and 4.

Turning now to FIG. 2, a waveform diagram shows the different time variables which can be measured by the monitoring circuit 20 with respect to the port A signal PAAx and the port "C" signal PCx. More specifically, at time t=0 the port A signal (PAAx) transitions from a high state to a low state to switch off the solenoid 14. A short period of time ($t_1$) after the t=0 transition of the port A signal, the port C signal or flyback voltage signal PCx will transition from a high state to a low state. A period of time ($t_2$) after this PAAx high to low transition, the port "C" signal will transition from the low state back to the high state.

The amount of time which elapses between time t=0 (port A high to low transition 30) and the leading edge transition 32 of the port C signal is represented by the variable LECNTx (equal to $t_1$). The amount of time which elapses between the port A transition 30 and the port C trailing edge transition 34 is represented by the variable TECNTx (equal to $t_2$). FIG. 2 also shows two windows of time which are defined around the leading edge transition 32 and the trailing edge transition 34 of the port C signal. More specifically, the window of time around the leading edge transition 32 is defined by the variables LEMINR and LEMAXR which are predefined minimum and maximum lead edge time variables measured from the port A transition 30 (time t=0). The window of time around the trailing edge transition 34 is defined by the variables TEMINR and TEMAXR which are also predefined minimum and maximum trailing edge time variables measured from the port A transition 30. As will be described below, the variables LEMINR, LEMAXR, TEMINR and TEMAXR are stored in memory registers as count values prior to the monitoring of the port C signal transitions. Count values representing the LECNTx and TECNTx variables are also stored in memory registers. The various count values once stored in their appropriate registers can then be quickly analyzed by the state machines associated with the present invention of the solenoid 14 and can detect and flag back to the transmission controller if a fault condition exists.

Figure 3A:
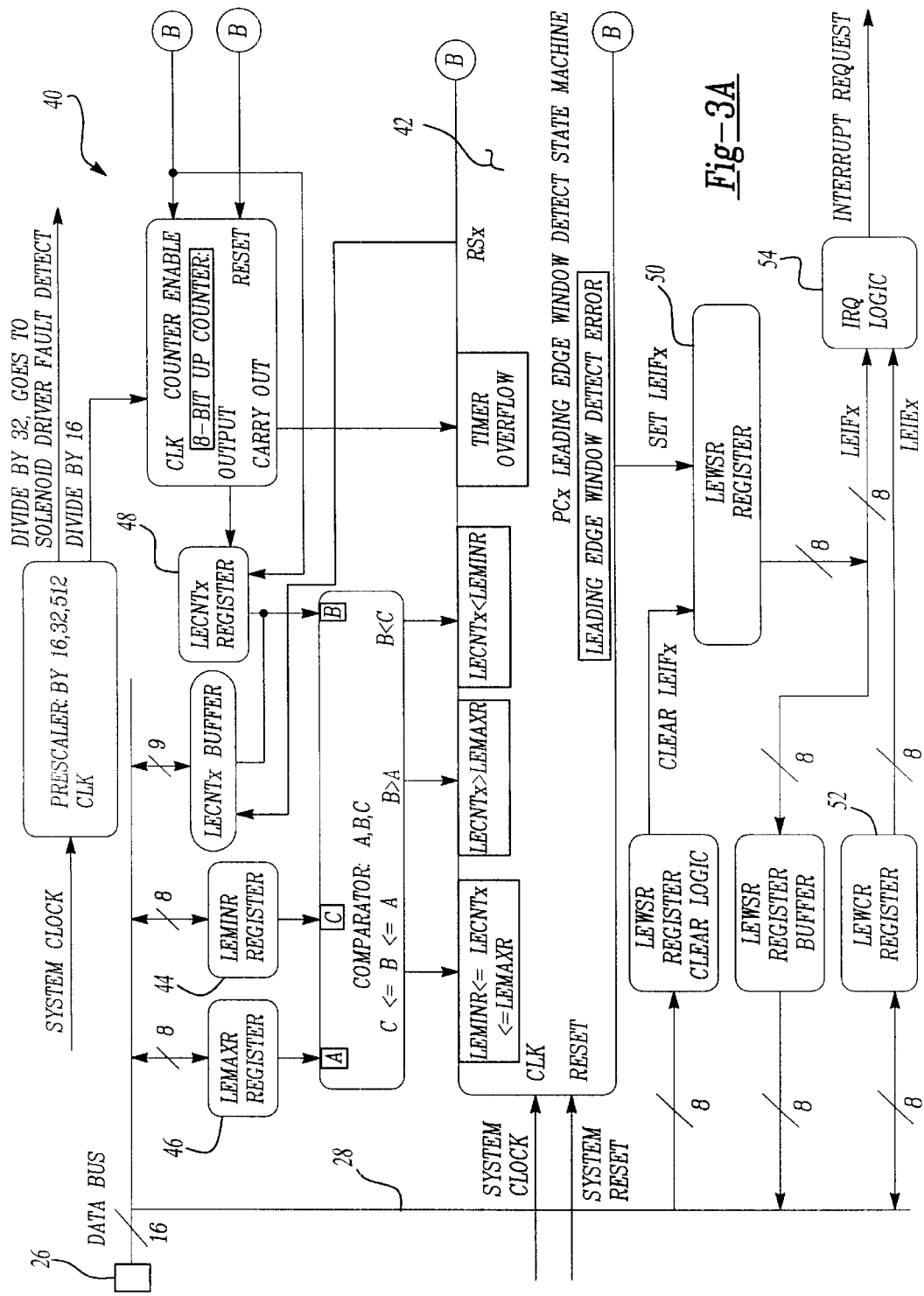
FIGS. 3A and 3B provide a schematic diagram showing the leading edge detection state machine associated with the flyback voltage monitoring circuit of the present invention.
Figure 3B:
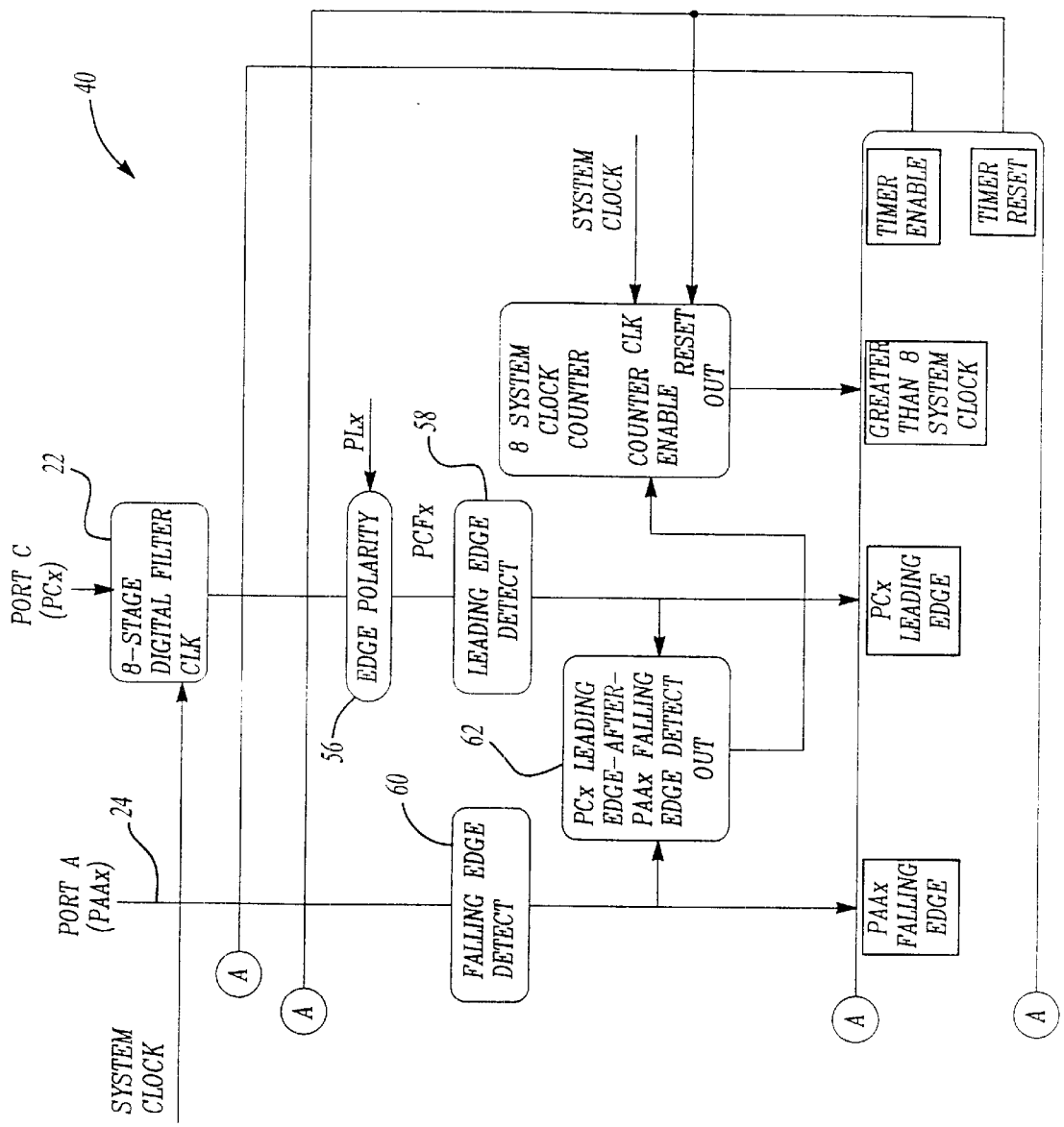

With reference to FIGS. 3A and 3B the leading edge processing circuit 40 associated with the flyback voltage monitoring circuit of the present invention will be described. The leading edge processing circuit 40 includes a leading edge window detect state machine 42 which processes the leading edge transition value LECNTx as well as the variables LEMINR, LEMAXR to detect a fault condition with regard to the leading edge window detect processing circuit 40. The data bus 16 communicates with a leading edge minimum window boundary register (LEMINR) 44 which is an 8-bit read/write register containing the minimum window boundary for the port C leading edge window detect. The leading edge minimum window boundary register 44 is universal to all leading edge window detect values PC0:PC6.

A leading edge maximum window boundary register (LEMAXR) 46 is connected to the data bus 16. The leading edge maximum window boundary register 46 is an 8-bit read/write register containing the maximum window boundary for the port C leading edge window detects. The leading edge maximum window boundary register is universal to all PC0:PC6 leading edge window detects. If the leading edge minimum boundary register 44 is greater than the leading edge maximum window boundary register 46, then improper operation of timer flags will result.

A leading edge window detect count register (LECNT0:LECNT6) 48 also communicates with the data bus 16. The leading edge window detect count registers 48 include 7 individual 16-bit port C leading edge window detect count registers containing the last completed timeout value at which time the leading edge of the corresponding port C flyback voltage (PCx) value is detected. These are read-only registers and the data in these registers are undefined on reset. Bits 0–7 are the leading edge window detect count value for the flyback voltage tie-back timer. Bits 8–14 are all 0's and bit 15 (RSx) is the status of the count value in bits 0–7. The run status bit (RSx) is a live flag indicating whether a timeout is in progress or not. The RSx bit gets set by the associated PAAx falling edge. The RSx bit gets cleared by the leading edge of the associated flyback voltage after the solenoid control signal PAAx falling edge or the event when port C tie-back timeout counter reaches its predetermined maximum value, which ever comes first.

A leading edge window detect status register (LEWSR) 50 is an 8-bit read/write status register containing the port C leading edge out of limit error status. The leading edge window detect status register 50 sets bits LEIF0:LEIF6 upon detection that the corresponding flyback voltage leading edge is out of leading edge minimum or maximum window boundary. The logic reads from the leading edge window detect status register (LEWSR) 50 bits LEIF0:LEIF6 are zero if there is no leading edge window detect error detected since last cleared and non-zero if a flyback voltage leading edge window detect error has occurred since last cleared. Writing a logic one to a particular leading edge window detect status register bit location shall clear that bit if it is set and writing a logic zero has no effect.

A leading edge window detect control register (LEWCR) 52 communicates with the data bus 16 and is a 16-bit read/write register containing the interrupt enable status of the port C leading edge window detect and flyback voltage (PCx) input polarity configuration control bits. The leading edge window detect circuit 40 has the capability of generating an interrupt request 54 to the transmission controller if any bit of the leading edge window detect error values LEIF0:LEIF6 in the leading edge window detect status register (LEWSR) 50 is set. The values LEIE0:LEIE6 in the leading edge window detect control register (LEWCR) 52 control the interrupt enable/disable of the corresponding bit of the LEIF0:LEIF6 in the leading edge window detect status register (LEWSR) 50. If the value LEIEx=0, the IRQ logic block 54 disables the LEIFx interrupt request to the transmission controller. If the LEIEx value is 1, the LEIFx interrupt request to the transmission controller is enabled and when the LEIFx bit is set, an interrupt will be generated.

The PL0:PL6 bits in the leading edge window detect control register (LEWCR) 52 control the polarities of the port C inputs PC0:PC6 to allow the port C circuitry to detect either positive pulses of the diagnostic signal at port C or negative pulses of the diagnostic signal at port C. If PLx=0, then the flyback voltage PCx accepts negative pulses and the leading edge of the flyback voltage signal PCx is the first falling edge and the trailing edge is the first rising edge. If the PLx bit is a 1, then the flyback voltage value PCx accepts positive pulses and the leading edge of the flyback voltage PCx signal is the first rising edge and the trailing edge is the first falling edge.

Shown in FIGS. 3A and 3B, each port C tie-back circuit PCx (PC0:PC6) is capable of providing a timer function which is always and only initiated upon the falling edge detect of the corresponding solenoid control signal PAAx output pin (PAA0:PAA6), and completed upon either the detection of the first flyback voltage (PCx) leading edge as determined by the polarity select bit PLx after triggered by a PAAx falling edge. At which time the value of the timer is placed into the leading edge window detect count register (LECNTx) 48. The completion of the timer is triggered by the leading edge of the corresponding port C input for the flyback voltage (PCx) (The output to the internal state machine of the port C input can be filtered to avoid noise coupled into the system.) Or the timer function can be completed upon completion of the timer count to a predetermined maximum value if a flyback voltage (PCx) leading edge is not detected after the timer is triggered by a PAAx falling edge, at which time the predetermined maximum value is placed into the leading edge window detect count register (LECNTx). The timer is retriggerable by each PAAx falling edge. If PAAx falls while a timeout is in progress, then the timeout progress is truncated and a new timeout begins (i.e. LECNTx is reset to 0). No further errors from the previous timeout period are flagged. The logic level of PAAx and the rising edge of PAAx after the timer has been triggered does not affect the timer function.

The following shows the operations of the leading edge window detects:

1. When the minimum and maximum boundary detect are both enabled (LEMINR (44)=$00–$FE, LEMAXR (46)=$01–$FF):
   a. At the PAAx falling edge, if PCx is logic high when PLx=0, or PCx is logic low when PLx=1:
      If LEMINR>LEMAXR, then the LEIFx bit in the LEWSR register 50 shall be set regardless of LECNTx.
      If LEMINR<=LECNTx<=LEMAXR, no error flag is set.
      If LECNTx<LEMINR<=LEMAXR then the corresponding LEIFx bit in LEWSR register 50 shall be set to a logic one at the time when the leading edge is detected.
      If LECNTx>LEMAXR and LEMINR<=LEMAXR then the corresponding LEIFx bit in LEWSR register 50 shall be set to a logic one at the time when the leading edge is detected or the completion of the leading edge timer (timer completion value=$FF), whichever occurs first.
   b. At the PAAx falling edge, if PCx is logic low when PLx=0, or PCx is logic high when PLx=1:
      The corresponding LEIFx bit in the LEWSR register 50 shall be set to logic one.
2. When the minimum boundary detect is disabled and maximum boundary detect is enabled (LEMINR=$FF, LEMAXR=$01–$FF):
   If LECNTx<=LEMAXR, no error flag is set.
   If LECNTx>LEMAXR, then the corresponding LEIFx bit in the LEWSR register 50 is set to logic one at the time when the leading edge is detected or the completion of leading edge timer (timer completion value=$FF), whichever occurs first.
3. When the minimum boundary detect is enabled and maximum boundary detect is disabled (LEMINR=$00–$FE, LEMAXR=$00):
   a. At the PAAx falling edge, if PCx is logic high when PLx=0, or PCx is logic low when PLx=1:
      If LECNTx>=LEMINR, no error flag is set.
      If LECNTx<LEMINR, then the corresponding LEIFx bit in the LEWSR register 50 is set to logic one at the time when the leading edge is detected.
   b. At the PAAx falling edge, if PCx is logic low when PLx=0, or PCx is logic high when PLx=1:
      The corresponding LEIFx bit in LEWSR register 50 shall be set to logic one.
4. When the minimum and maximum boundary detect are both disabled (LEMINR=$FF, LEMAXR=$00):

No error flag shall be set regardless of LECNTx.

If subsequent PCx leading edges arrive before another falling edge of PAAx, the edges are ignored. The LEIFx bit is cleared by writing a logic one to its location and cleared upon reset. A possible interrupt request to the transmission controller unit 16 on the setting of this flag (LEIFx) may be obtained by setting a corresponding interrupt enable bit LEIEx in the LEWCR register 52.

When the leading edge window detect timeout is in progress, writing to register LEMINR 44, LEMAXR 46 or LEWCR 52 (PL0:PL6) shall not affect the operations of the window detect state machine and the tieback time count shall be stored to LECNTx as normal operations. However, the error flags in LEWSR shall not be set in any fault condition for this timeout progress.

Figure 4A:
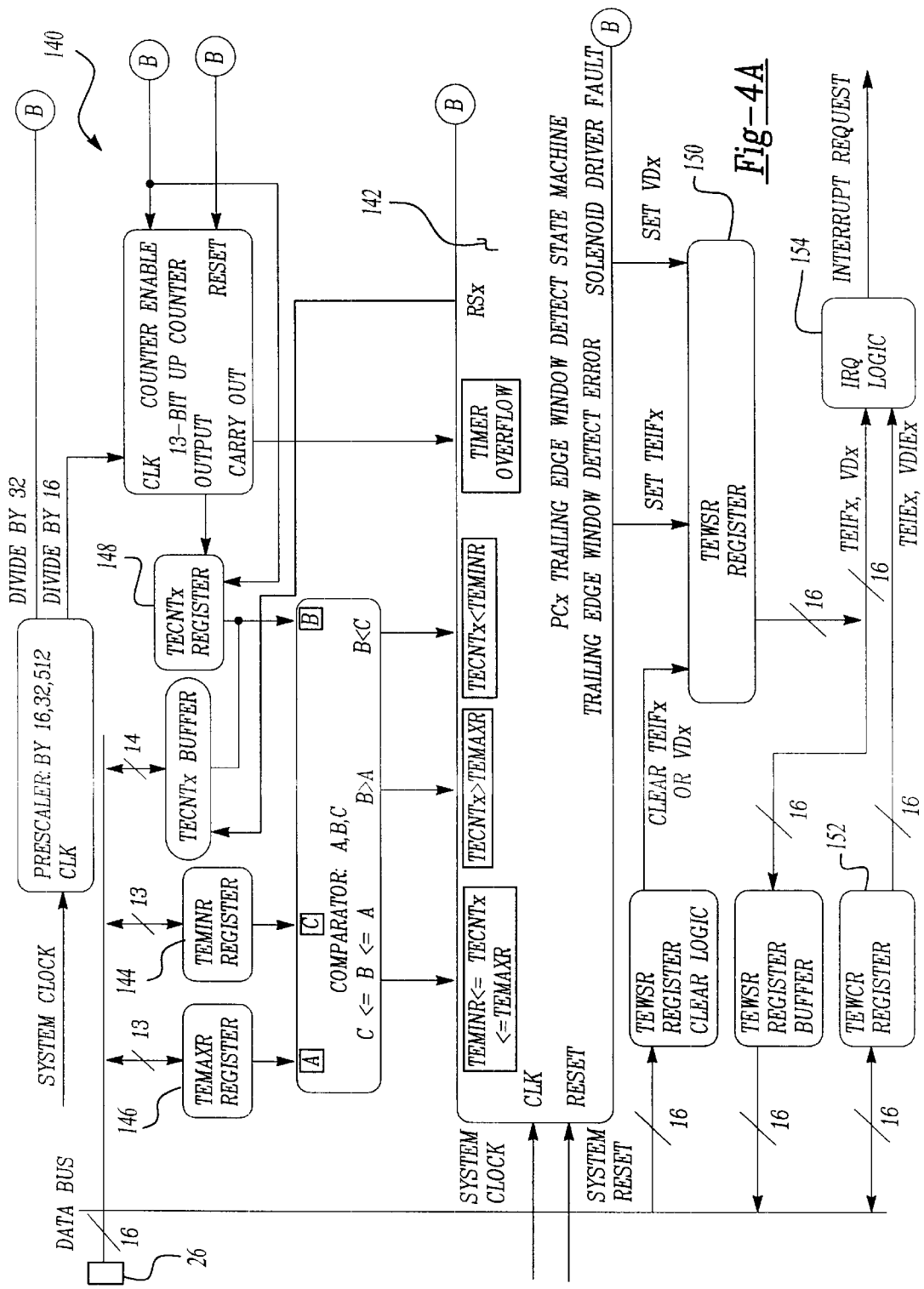
FIGS. 4A and 4B provide a schematic diagram showing the trailing edge detection state machine associated with the flyback voltage monitoring circuit of the present invention.
Figure 4B:
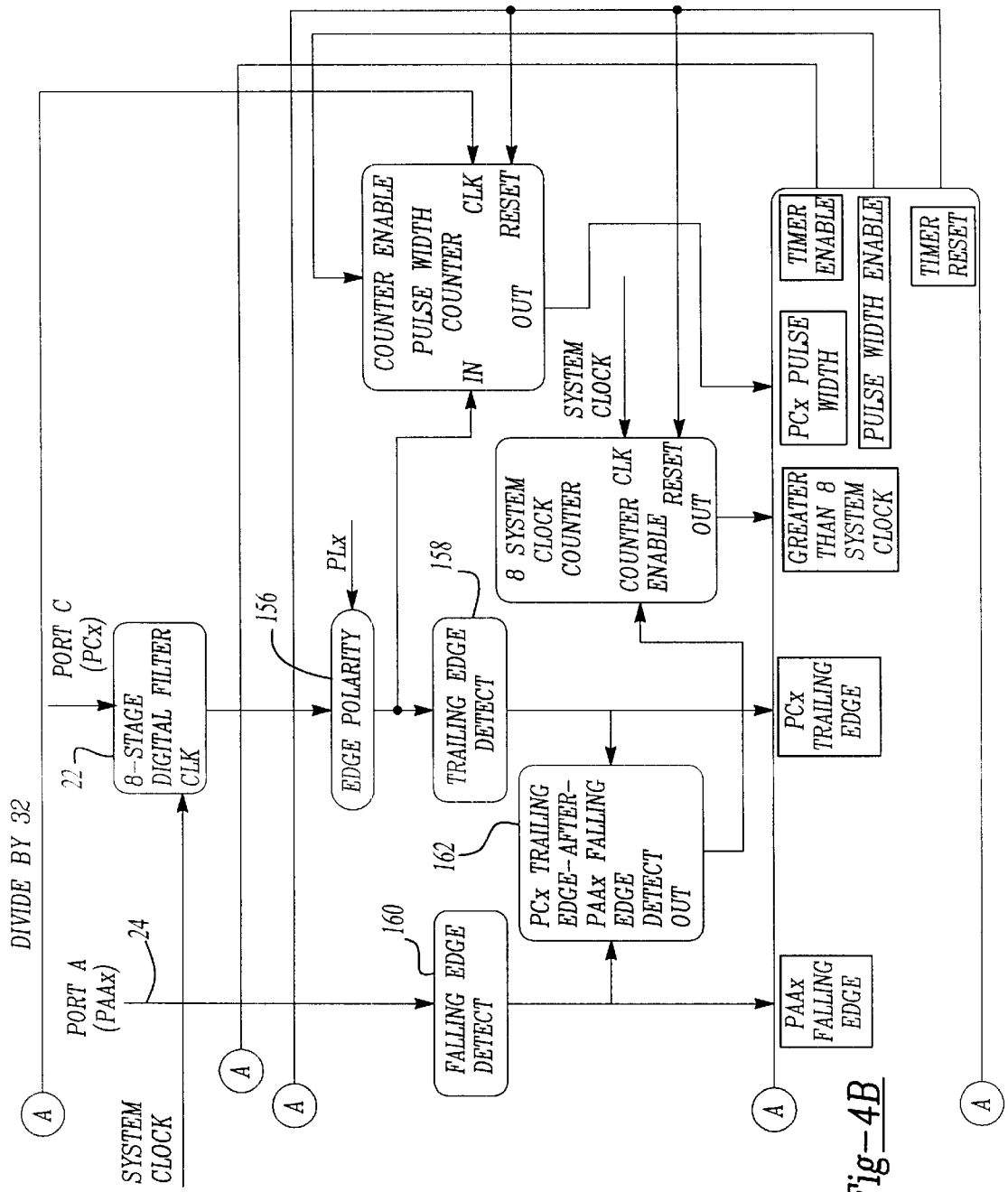

With reference to FIGS. 4A and 4B a trailing edge processing circuit 140 will now be described. The trailing edge processing circuit 140 includes a trailing edge window detect state machine 142 which processes the trailing edge transition value TECNTx as well as the variables TEMINR, TEMAXR to detect a fault condition with regard to the trailing edge window detect processing circuit 140. The data bus 16 communicates with a trailing edge minimum window boundary register (TEMINR) 144 which is a 16-bit read/write register containing the minimum window boundary for the port C trailing edge window detect. The trailing edge minimum window boundary register is universal to all trailing edge window detect values PC0:PC6.

A trailing edge maximum window boundary register (TEMAXR) 146 is connected to the data bus 16. The trailing edge maximum window boundary register 146 is a 16-bit read/write register containing the maximum window boundary for the port C trailing edge window detects. The trailing edge maximum window boundary register is universal to all PC0:PC6 trailing edge window detects.

A trailing edge window detect count register (TECNT0:TECNT6) 148 also communicates with the data bus 16. The trailing edge window detect count registers include 7 individual 16-bit port C trailing edge window detect count registers containing the last completed timeout value at which time the trailing edge of the corresponding port C flyback voltage (PCx) value is detected. These are read-only registers and the data in these registers are undefined on reset. Bits 0–12 are the trailing edge window detect count value for the flyback voltage tie-back timer. Bits 13–14 are all zeroes and bit 15 (RSx) is the status of the count value in bits 0–12. The run status bit (RSx) is a live flag indicating whether a timeout is in progress or not. The RSx bit gets set by the associated PAAx falling edge. The RSx bit gets cleared by the trailing edge of the associated flyback voltage (PCx) after the solenoid control signal (PAAx) falling edge or the event when the port C tie-back timeout counter reaches a predetermined maximum value, which ever comes first.

A trailing edge window detect status register (TEWSR) 150 is a 16-bit read/write status register containing the port C trailing edge out of limit error status and solenoid driver fault status. The trailing edge window detect status register (TEWSR) sets bits TEIF0:TEIF6 upon detection that the corresponding flyback voltage trailing edge is out of trailing edge minimum or maximum window boundary. The logic reads from the trailing edge window detect status register (TEWSR) bits TEIF0:TEIF6 are zero if there is no trailing edge window detect error detected since last cleared and non-zero if a flyback voltage trailing edge window detect error has occurred since last cleared. Bits VD0:VD6 are set when a pulse that is less than twenty system-clock/32 clocks on the corresponding filtered port C input is detected, which indicates the solenoid driver fault condition. If VDx equals zero, no fault has been detected with the solenoid driver which is tied to PCx. If VDx equals one, a fault has been detected with the solenoid driver which is tied to PCx since last cleared. Writing a logic one to a particular trailing edge window detect status register (TEWSR) bit location shall clear that bit if it is set and writing a logic zero has no effect.

A trailing edge window detect control register (TEWCR) 152 communicates with the data bus 16 and is a 16-bit read/write register containing the interrupt enable status of port C trailing edge window detect and solenoid driver fault detect. The trailing edge window detect circuit 140 has the capability of generating an interrupt request 154 to the transmission controller if any bit of the trailing edge window detect error values TEIF0:TEIF6 or VD0:VD6 in the trailing edge window detect status register (TEWSR) 150 is set. The values TEIE0:TEIE6 in the trailing edge window detect control register (TEWCR) 152 control the interrupt enable/disable of the corresponding bit of the TEIF0:TEIF6 in the trailing edge window detect status register (TEWSR) 150. VDIE0:VDIE6 control the interrupt enable/disable of the corresponding bit of VD0:VD6 in the trailing edge window detect status register (TEWSR) 150. If the value TEIEx=0, the IRQ logic block 154 disables the TEIFx interrupt request to the transmission controller. If the TEIEx value is one, the TEIFx interrupt request to the transmission controller is enabled, and if the TEIFx bit is set, an interrupt will be generated. If the value VDIEx equals zero, the VDx interrupt request to the transmission control unit is disabled. If the value VDIEx equals one, the VDx interrupt request to the transmission controller is enabled, and if the VDx bit is set, an interrupt will be generated.

Shown in FIGS. 4A and 4B, each port C tie-back circuit PCx (PC0:PC6) is capable of providing a timer function which is always and only initiated upon the falling edge detect of the corresponding solenoid control signal PAAx output pin (PAA0:PAA6), and completed upon either: (1) the detection of the first flyback voltage (PCx) trailing edge as determined by the PLx polarity select bit after triggered by a PAAx falling edge. At which time the value of the timer is placed into the trailing edge window detect count register (TECNTx) 148. The completion of the timer is triggered by the trailing edge of the corresponding C input for the flyback voltage (PCx), (the output to the internal state machine of the port C input can be filtered to avoid noise coupled in the system.); or (2) the timer function can be completed upon completion of the timer count to a predetermined value if a flyback voltage (PCx) trailing edge is not detected after the timer is triggered by a PAAx falling edge, at which time the predetermined maximum value is placed into the trailing edge window detect count register (TECNTx). The timer is retriggerable by each PAAx falling edge. If PAAx falls while a timeout is in progress, then the timeout progress is truncated and a new timeout begins (i.e., TECNTx is reset to zero). No further errors from the previous timeout period are flagged. The logic level of PAAx and the rising edge of PAAx after the timer has been triggered does not affect the timer function.

The following shows the operations of the trailing edge window detects:

1. When the minimum and maximum boundary detect are both enabled (TEMINR=$0000–$1FFE, TEMAXR=$001–$1FFF):
    If TEMINR>TEMAXR, then TEIFx bit in the TEWSR register 150 shall be set regardless of TECNTx.
    If TEMINR<=TECNTx<=TEMAXR, no error flag is set.

If TECNTx<TEMINR and TEMINR<=TEMAXR then the corresponding TEIFx bit in the TEWSR register 150 shall be set to logic one at the time when the trailing edge is detected.

If TECNTx>TEMAXR and TEMINR<=TEMAXR then the corresponding TEIFx bit in the TEWSR register 150 shall be set to logic one at the time when the trailing edge is detected or the completion of the trailing edge detect timer (timer completion value=$1FFF), whichever occurs first.

2. When the minimum boundary detect is disabled and maximum boundary detect is enabled (TEMINR=$1FFF, TEMAXR=$0001–$1FFF):

If TECNTx<=TEMAXR, no error flag is set.

If TECNTx>TEMAXR, then the corresponding TEIFx bit in the TEWSR register 150 is set to a logic one at the time when the trailing edge is detected or the completion of the trailing edge detect timer (timer completion value=$1FFF), whichever occurs first.

3. When the minimum boundary detect is enabled and maximum boundary detect is disabled (TEMINR=$0000–$1FFE, TEMAXR=$0000):

If TECNTx>=TEMINR, no error flag is set.

If TECNTx<TEMINR, then the corresponding TEIFx bit in the TEWSR register 150 is set to a logic one at the time when the trailing edge is detected.

4. When the minimum and maximum boundary detect are both disabled (TEMINR=$1FFF, TEMAXR=$0000):

No error flag shall be set regardless of TECNTx.

If subsequent PCx trailing edges arrive before another falling edge of PAAx, the edges are ignored. TEIFx bit is cleared by writing a logic one to its location and cleared upon reset. A possible interrupt request to the transmission control unit 16 on the setting of this flag (TEIFx) may be obtained by setting a corresponding interrupt enable bit TEIEx in the TEWCR register 152.

When the trailing edge window detect timeout is in progress, writing to register TEMINR 144, TEMAXR 146 or TEWCR 152 (PL0:PL6) shall not affect the operations of the window detect state machine 142 and the tieback time count shall be stored to TECNTx as normal operations. However, the error flags in TEWSR 150 shall not be set in any fault condition for this timeout progress.

As shown in FIGS. 4A–4B, each port C tie-back circuit PCx (PC0:PC6) shall be capable of providing a timer function which will set VDx bit in the TEWSR register 150 to a logic one when the PCx (PCx can be filtered to avoid noise coupled into the system) transitions from a logic high to a logic low level, and then transitions to a logic high level when the PLx bit in the LEWCR register 50 is a logic zero, or, a logic low to a logic high level, and then transitions to a logic low level when PLx bit in the LEWCR register 50 is a logic one within twenty system-clock/32 clocks at any time. The Solenoid Driver Fault Detect circuit shall be independent of port C tie-back window detect circuits.

When the solenoid driver fault detect timeout is in progress, writing to register LEWCR (PL0:PL6) 52 shall not affect the operations of state machine. However, the corresponding error flag(s) in TEWSR (VD0:VD6) 152 shall not be set in any fault condition for this timeout progress.

Refer to FIG. 5 for examples of solenoid driver fault detect. The examples show the timing of PCx negative pulse with PLx=0.

EXAMPLE 1

PCx pulse is 7 system clock/32 wide and detected by Solenoid Driver Fault Detect logic. The corresponding VDx is set in this example.

EXAMPLE 2

If a filter is used to filter Port C to avoid noise coupled into the system, a PCx pulse is 7 system clock wide and filtered out by a port C input filter. No VDx is set.

EXAMPLE 3

PCx pulse is 21 system clock/32 wide and rejected by Solenoid Driver Fault Detect logic. No VDx is set.

The foregoing discussion discloses and describes exemplary embodiments of the present invention. One skilled in the art will readily recognize from such discussion, and from the accompanying drawings and claims, that various changes, modifications, and variations can be made therein without departing from the spirit and scope of the invention as defined in the following claims.

What is claimed is:

1. A system for monitoring a flyback voltage of a solenoid comprising:

a wave shaping circuit for transforming the flyback voltage to a logic level signal, the logic level signal having a leading edge and a trailing edge;

a leading edge detection circuit for detecting a leading edge of the logic level signal, the leading edge detection circuit defining a leading edge timing window, and the leading edge detection circuit having a comparison circuit for determining whether the leading edge of the logic level signal falls within the leading edge timing window, the comparison circuit providing a plurality of signals to a state machine, wherein the state machine sets a flag variable if the leading edge of the logic level signal falls outside the leading edge timing window;

a trailing edge detection circuit for detecting a trailing edge of the logic level signal, the trailing edge detection circuit defining a trailing edge timing window, and the trailing edge detection circuit having a comparison circuit for determining whether the trailing edge of the logic level signal falls within said trailing edge timing window, the comparison circuit providing a plurality of signals to a state machine, wherein the state machine sets a flag variable if the trailing edge of the logic level signal falls outside the trailing edge timing window;

a register for accumulating the flags generated by the leading edge and trailing edge detection circuits; and a processor for monitoring the flags stored within the register, the processor reading the contents of the register to determine if the leading edge signal and the trailing edge signal are within their predefined windows.

2. A method of monitoring degradation of a solenoid, comprising the steps of:

switching off the solenoid;

transforming a flyback voltage to a logic level signal having a leading edge and a trailing edge;

detecting a leading edge of the logic level signal;

determining if the leading edge of the logic level signal is within a leading edge timing window;

detecting a trailing edge of the logic level signal;

determining if the trailing edge of the logic level signal is within a trailing edge timing window;

wherein a fault condition is identified if the leading edge is determined to be outside of said leading edge timing window or if the trailing edge is determined to be outside of said trailing edge timing window.

* * * * *